(12) United States Patent
Johnston et al.

(10) Patent No.: US 10,379,450 B2
(45) Date of Patent: Aug. 13, 2019

(54) APPARATUS AND METHODS FOR ON-THE-FLY DIGITAL EXPOSURE IMAGE DATA MODIFICATION

(71) Applicant: Applied Materials, Inc., Santa Clara, CA (US)

(72) Inventors: Benjamin M. Johnston, Los Gatos, CA (US); Thomas L. Laidig, Richmond, CA (US); Jang Fung Chen, Cupertino, CA (US); John White, Hayward, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/867,369

(22) Filed: Jan. 10, 2018

(65) Prior Publication Data

US 2018/0129142 A1   May 10, 2018

Related U.S. Application Data

(63) Continuation of application No. 15/080,473, filed on Mar. 24, 2016, now Pat. No. 9,927,723.

(60) Provisional application No. 62/142,299, filed on Apr. 2, 2015, provisional application No. 62/137,785, filed on Mar. 24, 2015.

(51) Int. Cl.
   *G03B 27/42* (2006.01)
   *G03F 7/20* (2006.01)
   *G01B 11/14* (2006.01)

(52) U.S. Cl.
   CPC .......... *G03F 7/70775* (2013.01); *G01B 11/14* (2013.01); *G03F 7/70275* (2013.01); *G03F 7/70733* (2013.01)

(58) Field of Classification Search
   CPC combination set(s) only.
   See application file for complete search history.

(56) References Cited

U.S. PATENT DOCUMENTS

| | | |
|---|---|---|
| 8,253,923 B1 | 8/2012 | Chen et al. |
| 8,390,781 B2 | 3/2013 | Laidig |
| 8,390,786 B2 | 3/2013 | Laidig |
| 8,395,752 B2 | 3/2013 | Laidig |
| 8,670,106 B2 | 3/2014 | Chen et al. |
| 9,025,136 B2 | 5/2015 | Chen et al. |
| 2006/0077396 A1 | 4/2006 | Park |

(Continued)

*Primary Examiner* — Mesfin T Asfaw
(74) *Attorney, Agent, or Firm* — Patterson + Sheridan LLP

(57) ABSTRACT

Embodiments of the present disclosure generally relate to apparatus and methods for performing photolithography processes. In one embodiment, a system including multiple interferometers for accurately measuring the location of a substrate during operation is provided. The system may include two chucks, and the two chucks are aligned in a first direction. The interferometers are placed along the first direction to measure the location of the substrate with respect to the first direction. The reduced distance between the interferometers and the chuck improves the accuracy of the measurement of the location of the substrate. In another embodiment, mask pattern data is provided to the system, and the mask pattern data is modified based on location and position information of the substrate. By controlling the mask pattern data with the location and position information of the substrate, less positional errors of the pattern formed on the substrate can be achieved.

20 Claims, 10 Drawing Sheets

(56) References Cited

U.S. PATENT DOCUMENTS

2007/0127006 A1* 6/2007 Shibazaki ........... G03F 7/70341
  355/72
2012/0026478 A1 2/2012 Chen et al.
2013/0207544 A1 8/2013 Kaskey et al.
2014/0192334 A1 7/2014 Chen et al.

* cited by examiner

APPARATUS AND METHODS FOR ON-THE-FLY DIGITAL EXPOSURE IMAGE DATA MODIFICATION

CROSS-REFERENCE TO RELATED APPLICATIONS

This application is a continuation application of co-pending U.S. patent application Ser. No. 15/080,473 filed Mar. 24, 2016 which claims priority to U.S. Provisional Patent Application Ser. No. 62/137,785, filed on Mar. 24, 2015, and U.S. Provisional Patent Application Ser. No. 62/142,299, filed on Apr. 2, 2015. Both of the aforementioned applications are incorporated by reference herein.

BACKGROUND

Field

Embodiments of the present disclosure generally relate to systems and methods for processing one or more substrates, and more specifically to systems and methods for performing photolithography processes.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to this technique, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices to consumers at the prices demanded by consumers, new apparatuses and approaches are needed to precisely and cost-effectively create patterns on substrates, such as large area substrates.

SUMMARY

Embodiments of the present disclosure generally relate to apparatus and methods for performing photolithography processes. In one embodiment, a system including multiple interferometers for accurately measuring the location of a substrate during operation is provided. The system may include two chucks, and the two chucks are aligned in a first direction. The interferometers are placed along the first direction to measure the location of the substrate with respect to the first direction. The reduced distance between the interferometers and the chuck improves the accuracy of the measurement of the location of the substrate. In another embodiment, mask pattern data is provided to the system, and the mask pattern data is modified based on location and position information of the substrate. By controlling the mask pattern data with the location and position information of the substrate, less positional errors of the pattern formed on the substrate can be achieved.

In one embodiment, a system includes a slab, and two chucks disposed on the slab. The two chucks are aligned in a first direction, and each chuck has a first side facing the other chuck, a second side opposite the first side, a third side connecting the first and second sides, and a fourth side opposite the third side. The system further includes at least one first interferometer disposed on the slab at a location adjacent the third side of one of the two chucks during operation, and two second interferometers disposed on the slab along a second direction. The second direction is substantially perpendicular to the first direction.

In another embodiment, a system includes a slab and two chucks disposed on the slab. The two chucks are aligned in a first direction, and each chuck has a first side facing the other chuck, a second side opposite the first side, a third side connecting the first and second sides, and a fourth side opposite the third side. The system further includes a first interferometer disposed on the slab adjacent the third side of one of the two chucks, a second interferometer disposed on the slab adjacent the third side of the other of the two chucks, a third interferometer disposed on the slab, and a fourth interferometer disposed on the slab. The second and third interferometers are disposed along the first direction.

In another embodiment, a method includes moving a substrate under a system in a first direction, providing mask pattern data to the image projection system, providing location and position information of the substrate to a controller, and modifying the mask pattern data using the location and position information.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments of the present disclosure generally relate to apparatus and methods for performing photolithography processes. In one embodiment, a system including multiple interferometers for accurately measuring the location of a substrate during operation is provided. The system may include two chucks, and the two chucks are aligned in a first direction. The interferometers are placed along the first direction to measure the location of the substrate with respect to the first direction. The reduced distance between the interferometers and the chuck improves the accuracy of the measurement of the location of the substrate. In another embodiment, mask pattern data is provided to the system, and the mask pattern data is modified based on location and position information of the substrate. By controlling the mask pattern data with the location and position information of the substrate, less positional errors of the pattern formed on the substrate can be achieved.

Figure 1:
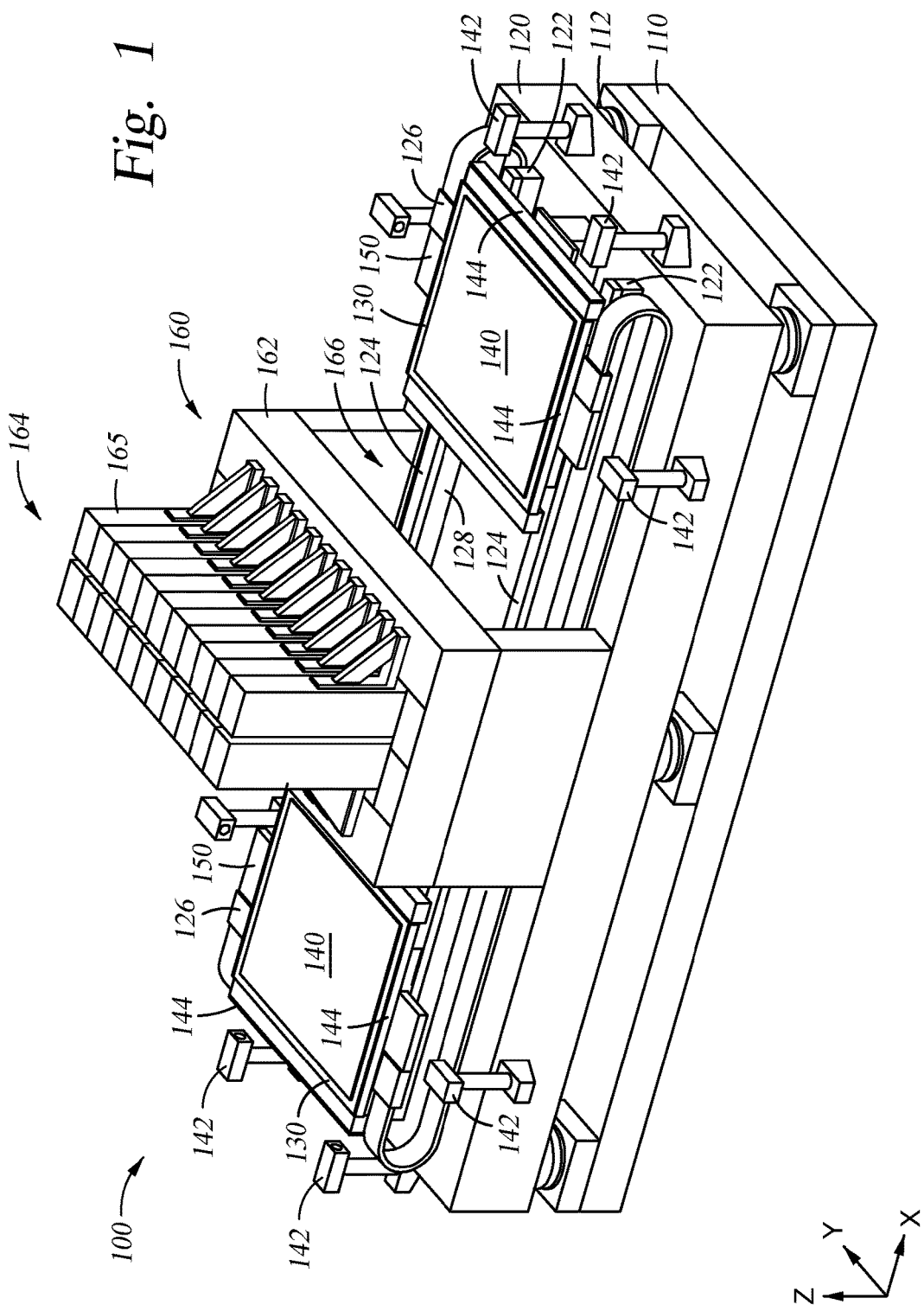
FIG. 1 is a perspective view of a system that may benefit from embodiments disclosed herein.

FIG. 1 is a perspective view of a system 100 that may benefit from embodiments disclosed herein. The system 100 includes a base frame 110, a slab 120, two or more chucks 130, and a processing apparatus 160. The base frame 110 may rest on the floor of a fabrication facility and may support the slab 120. Passive air isolators 112 may be positioned between the base frame 110 and the slab 120. The slab 120 may be a monolithic piece of granite, and the two or more chucks 130 may be disposed on the slab 120. In some embodiments, two chucks 130 are disposed on the slab 120 and the two chucks 130 are aligned in a first direction, such as the X-direction, as shown in FIG. 1. A substrate 140 may be supported by each of the two or more chucks 130. A plurality of holes (not shown) may be formed in each chuck 130 for allowing a plurality of lift pins (not shown) to extend therethrough. The lift pins may rise to an extended position to receive the substrate 140, such as from a transfer robot (not shown). The transfer robot may position the substrate 140 on the lift pins, and the lift pins may thereafter gently lower the substrate 140 onto each chuck 130.

The substrate 140 may, for example, be made of alkaline earth boro-aluminosilicate glass and be used as part of a flat panel display. In other embodiments, the substrate 140 may be made of other materials. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to photoresist developer applied to the photoresist after the pattern is written into the photoresist. The chemical composition of the photoresist determines whether the photoresist will be a positive photoresist or negative photoresist. For example, the photoresist may include at least one of diazonaphthoquinone, a phenol formaldehyde resin, poly(methyl methacrylate), poly(methyl glutarimide), and SU-8. In this manner, the pattern may be created on a surface of the substrate 140 to form the electronic circuitry.

The system 100 may further include a pair of supports 122 and a pair of tracks 124. The pair of supports 122 may be disposed on the slab 120, and the slab 120 and the pair of supports 122 may be a single piece of material. The pair of tracks 124 may be supported by the pair of the supports 122, and the two or more chucks 130 may move along the tracks 124 in the X-direction. In one embodiment, the pair of tracks 124 is a pair of parallel magnetic channels. As shown, each track 124 of the pair of tracks 124 is linear. In other embodiments, the track 124 may have a non-linear shape. An encoder 126 may be coupled to each chuck 130 in order to provide location information of the substrate 140 to a controller (not shown). The encoder 126 may be an optical encoder that measures the location information of the substrate 140. The chuck 130 is a distance away from the encoder 126 in the Z-direction, and the distance may be 200 to 250 mm. Due to the stiffness of the structure, the actual location of the chuck 130 in the X-direction or Y-direction and the location of the chuck 130 measured by the encoder 126 in the X-direction or the Y-direction may be off by 300 to 500 nm. In order to more accurately measure the location of the substrate 140 during operation, a plurality of interferometers 142 may be disposed on the slab 120 and the interferometers 142 are aligned with mirrors 144 coupled to each chuck 130. The mirrors 144 are located closer to the substrate 140 in the Z-direction that the encoder 126, thus the location information measured by the interferometers 142 is more accurate than the location information measured by the encoder 126. The chuck 130 may be a vacuum chuck that can secure the substrate 140 to the chuck 130, so the difference in location between the chuck 130 and the substrate 140 is minimized. The interferometers 142 may be any suitable interferometers, such as high stability plane mirror (HSPM) interferometers. The location information of the substrate 140 measured by the interferometers 142 may be provided to the controller (not shown). The interferometers 142 are described in detail in FIG. 7, FIG. 8 and FIG. 9.

The processing apparatus 160 may include a support 162 and a processing unit 164. The support 162 may be disposed on the slab 120 and may include an opening 166 for the two or more chucks 130 to pass under the processing unit 164. The processing unit 164 may be supported by the support 162. In one embodiment, the processing unit 164 is a pattern generator configured to expose a photoresist in a photolithography process. In some embodiments, the pattern generator may be configured to perform a maskless lithography process. The processing unit 164 may include a plurality of image projection systems (shown in FIG. 3) disposed in a case 165. The processing apparatus 160 may be utilized to perform maskless direct patterning. During operation, one of the two or more chucks 130 moves in the X-direction from a loading position, as shown in FIG. 1, to a processing position. The processing position may refer to one or more positions of the chuck 130 as the chuck 130 passes under the processing unit 164. During operation, the two or more chucks 130 may be lifted by a plurality of air bearings 202 (shown in FIG. 2) and may move along the pair of tracks 124 from the loading position to the processing position. A plurality of vertical guide air bearings (not shown) may be coupled to each chuck 130 and positioned adjacent an inner wall 128 of each support 122 in order to stabilize the movement of the chuck 130. Each of the two or more chucks 130 may also move in the Y-direction by moving along a track 150 for processing and/or indexing the substrate 140.

Figure 2:
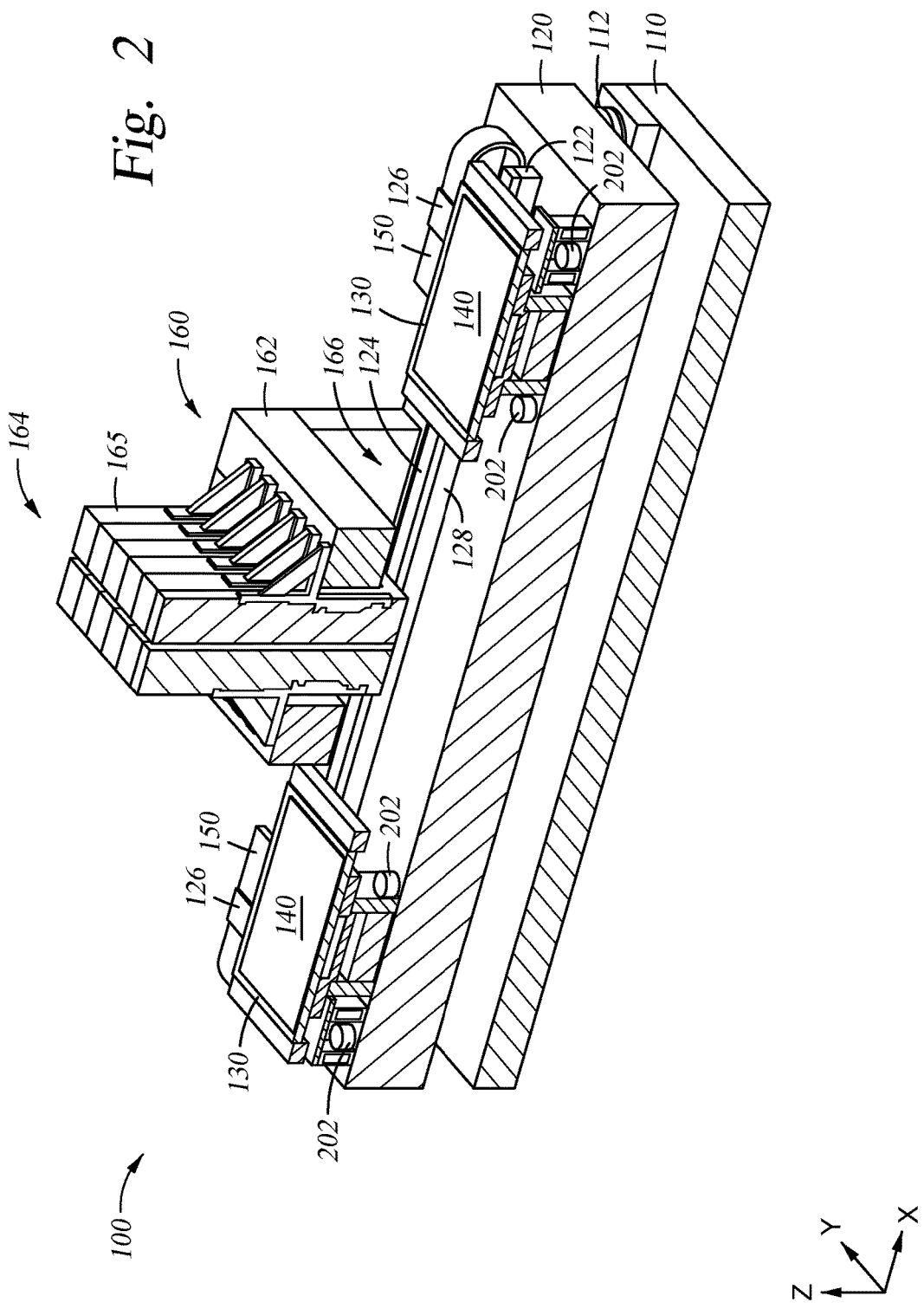
FIG. 2 is a cross-sectional side view of the system of FIG. 1 according to one embodiment.

FIG. 2 is a cross-sectional side view of the system 100 of FIG. 1 according to one embodiment. The interferometers 142 are omitted for better illustration of other components.

As shown, each chuck 130 includes a plurality of air bearings 202 for lifting the chuck 130. Each chuck 130 may also include a motor coil (not shown) for moving the chuck 130 along the tracks 124. The two or more chucks 130 and the processing apparatus 160 may be enclosed by an enclosure (not shown) in order to provide temperature and pressure control.

The system 100 also includes a controller (not shown). The controller is generally designed to facilitate the control and automation of the processing techniques described herein. The controller may be coupled to or in communication with one or more of the processing apparatus 160, the chucks 130, and the interferometers 142. The processing apparatus 160 and the chucks 130 may provide information to the controller regarding the substrate processing and the substrate aligning. For example, the processing apparatus 160 may provide information to the controller to alert the controller that substrate processing has been completed. The interferometers 142 may provide location information to the controller, and the location information is then used to control the chucks 130 and the processing apparatus 160.

The controller may include a central processing unit (CPU) (not shown), memory (not shown), and support circuits (or I/O) (not shown). The CPU may be one of any form of computer processors that are used in industrial settings for controlling various processes and hardware (e.g., pattern generators, motors, and other hardware) and monitor the processes (e.g., processing time and substrate position). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. The program may be software readable by the controller and may include code to monitor and control, for example, the processing time and substrate position.

Figure 3:
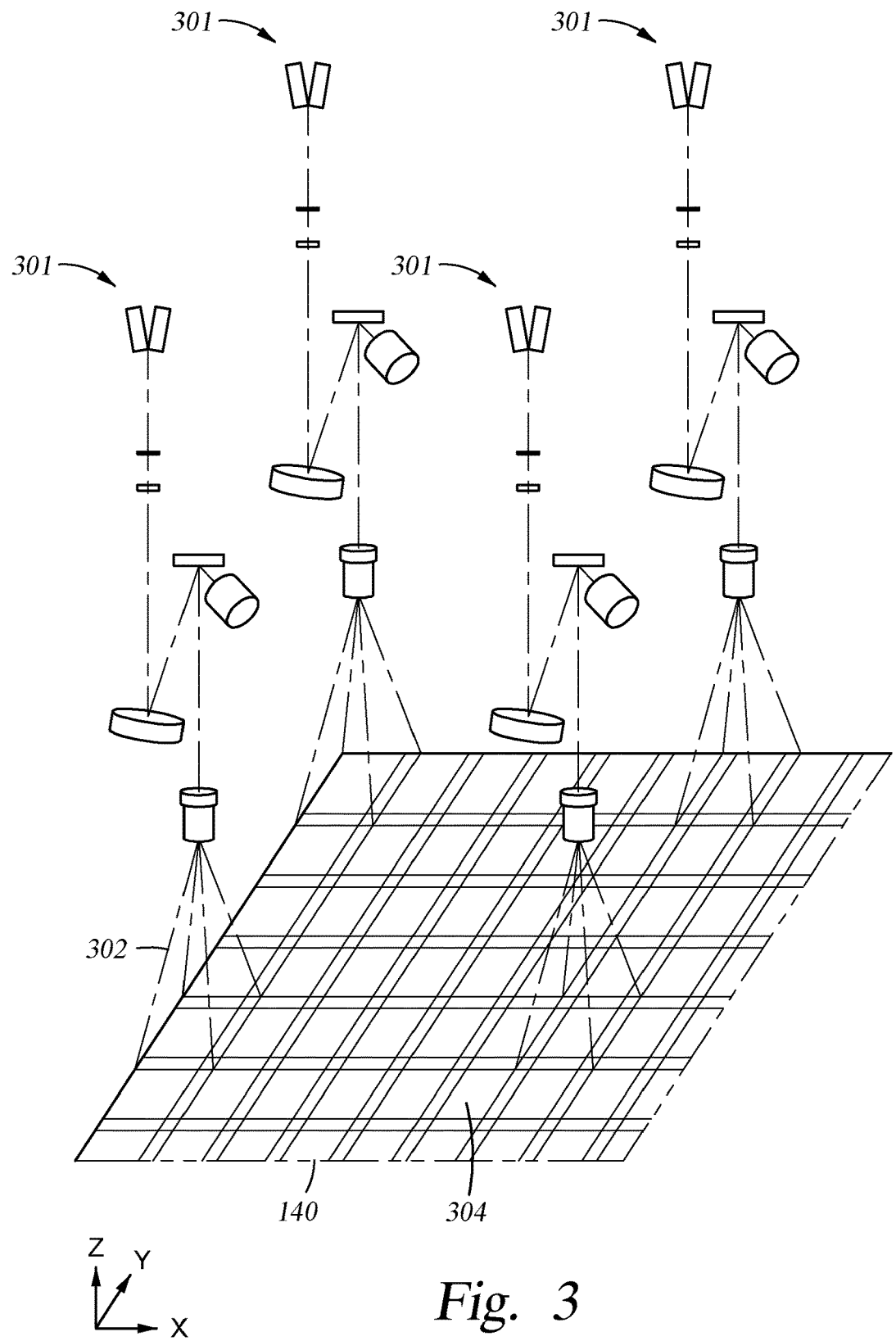
FIG. 3 is a perspective schematic view of a plurality of image projection systems according to one embodiment.

FIG. 3 is a perspective schematic view of a plurality of image projection systems 301 according to one embodiment. As shown in FIG. 3, each image projection system 301 produces a plurality of light beams 302 onto a surface 304 of the substrate 140. As the substrate 140 moves in the X-direction and Y-direction, the entire surface 304 may be patterned by the light beams 302. The number of the image projection systems 301 may vary based on the size of the substrate 140 and/or the speed of the chuck 130. In one embodiment, there are 22 image projection systems 301 in the processing apparatus 160.

Figure 4:
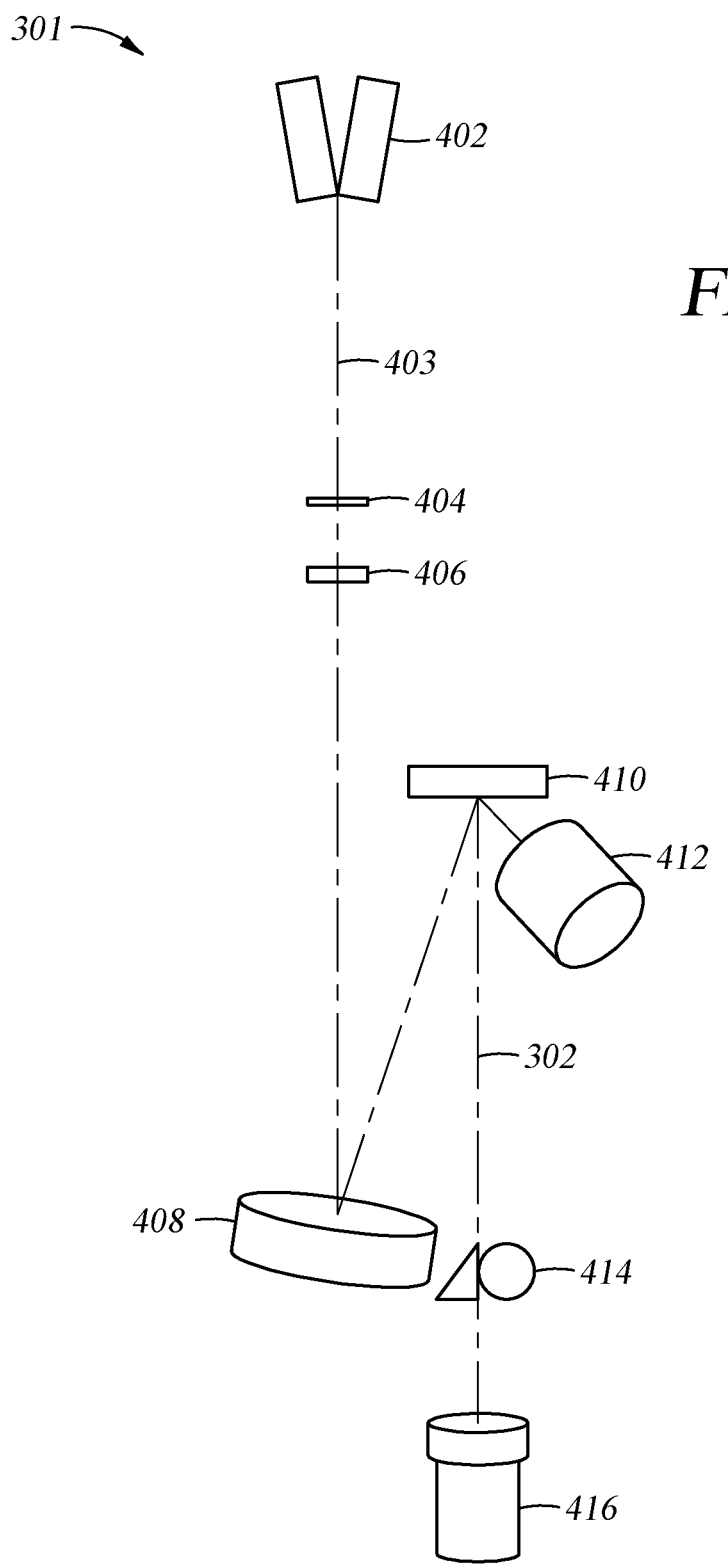
FIG. 4 is a perspective schematic view of an image projection system of the plurality of image projection devices of FIG. 3 according to one embodiment.

FIG. 4 is a perspective schematic view of one image projection system 301 of the plurality of image projection systems 301 of FIG. 3 according to one embodiment. The image projection system 301 may include a light source 402, an aperture 404, a lens 406, a mirror 408, a DMD 410, a light dump 412, a camera 414, and a projection lens 416. The light source 402 may be a light emitting diode (LED) or a laser, and the light source 402 may be capable of producing a light having predetermined wavelength. In one embodiment, the predetermined wavelength is in the blue or near ultraviolet (UV) range, such as less than about 450 nm. The mirror 408 may be a spherical mirror. The projection lens 416 may be a 10× objective lens. The DMD 410 may include a plurality of mirrors, and the number of mirrors may correspond to the resolution of the projected image. In one embodiment, the DMD 410 includes 1920×1080 mirrors, which represent the number of pixels of a high definition television.

During operation, a light beam 403 having a predetermined wavelength, such as a wavelength in the blue range, is produced by the light source 402. The light beam 403 is reflected to the DMD 410 by the mirror 408. The DMD 410 includes a plurality of mirrors that may be controlled individually, and each mirror of the plurality of mirrors of the DMD 410 may be at "on" position or "off" position, based on the mask data provided to the DMD 410 by the controller (not shown). When the light beam 403 reaches the mirrors of the DMD 410, the mirrors that are at "on" position reflect the light beam 403, i.e., forming the plurality of write beams 302, to the projection lens 416. The projection lens 416 then projects the write beams 302 to the surface 304 of the substrate 140. The mirrors that are at "off" position reflect the light beam 403 to the light dump 412 instead of the surface 304 of the substrate 140.

Figure 5:
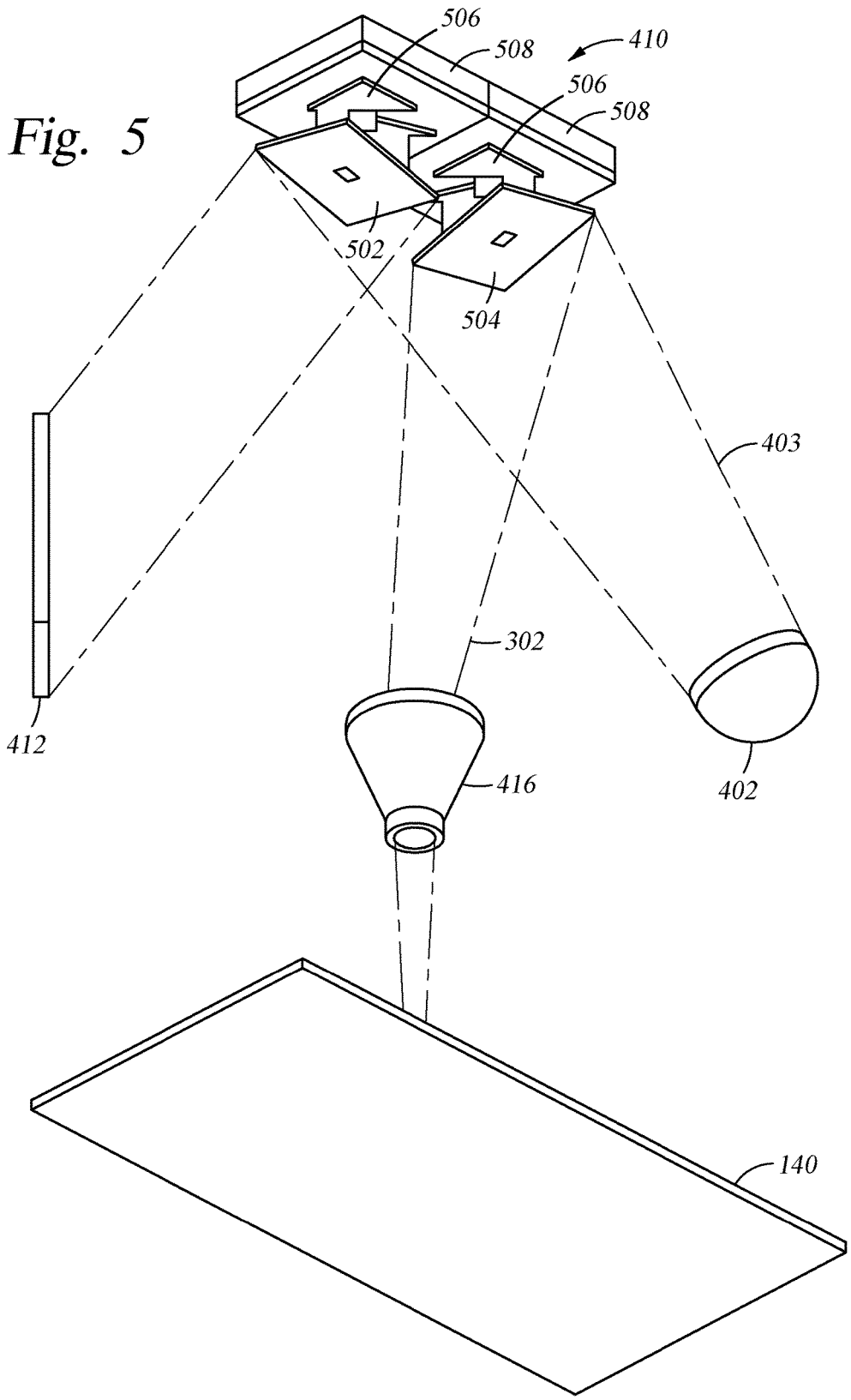
FIG. 5 schematically illustrates a beam being reflected by two mirrors of a DMD according to one embodiment.

FIG. 5 schematically illustrates the beam 403 being reflected by two mirrors 502, 504 of a DMD 410 according to one embodiment. As shown, each mirror 502, 504 is disposed on a titling mechanism 506, which is disposed on a memory cell 508. The memory cell 508 may be a CMOS SRAM. During operation, each mirror 502, 504 is controlled by loading the mask pattern data into the memory cell 508. The mask pattern data electrostatically controls the tilting of the mirror 502, 504 in a binary fashion. When the mirror 502 or 504 is in a reset mode or without power applied to the DMD 410, the mirror 502 or 504 is set to be flat and not corresponding to any binary position. When power is applied to the DMD 410, 0 in binary may correspond to "off" position, which means the mirror 502 or 504 is tilted at −10, −12 or any feasible negative tilting degrees, and 1 in binary may correspond to "on" position, which means the mirror is tilted at 10, 12 or any feasible positive tilting degrees. For example, as shown in FIG. 5, the mirror 502, which is at "off" position, reflects the light beam 403 generated from the light source 402 to the light dump 412. The mirror 504, which is at "on" position, forms the light beam 302 by reflecting the light beam 403 to the projection lens 416.

Figure 6:
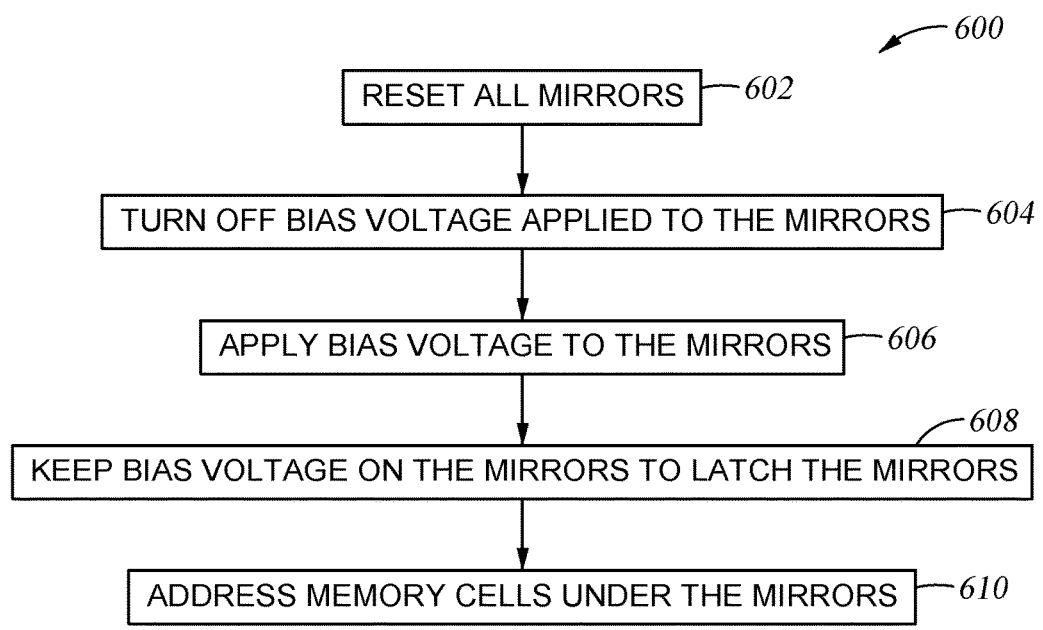
FIG. 6 illustrates a process sequence of the DMD according to one embodiment.

FIG. 6 illustrates a process sequence 600 of the DMD 410 according to one embodiment. At block 602, all of the mirrors of the DMD 410 may be reset. Reset refers to the mirrors being temporarily released from the controlling of the memory cells. Next, at block 604, a bias voltage applied to the mirrors is turned off, causing all of the mirrors to be flat relative to the substrate. At block 606, the bias voltage is turned back on, and the mask pattern data stored in the memory cell is used to cause the mirrors to tilt to "on" or "off" position. At block 608, the bias voltage applied to the DMD 410 is maintained in order to latch the mirrors at "on" or "off" position. During this period, the light source produces the light beam, or a light pulse, to the plurality of mirrors, and the mirrors at "on" position reflect the light beam to a surface of a substrate that is moving under the DMD 410. At block 610, the SRAM memory cells are addressed, or updated, with mask pattern data while the mirrors are latched. Because the mirrors are latch, the new mask pattern data would not affect the positions of the mirrors. At block 610, the mask pattern data provided to each memory cell of one mirror corresponds to one mirror pixel. If the mirror is at "on" position, the respective mirror pixel forms a light image pixel on an area of the surface of the substrate. If the mirror is at "off" position, the respective mirror pixel does not form a light image pixel on an area of the surface of the substrate. The process sequence 600 may have a time duration of about 60 microseconds, and a time duration of reflecting the light beam to the surface of the substrate by the mirrors of the DMD 410 may be about 10 to 15 microseconds. The process sequence 600 of the DMD 410 may be repeated in order to pattern the surface of the substrate as the substrate moves under the DMD 410. The process sequence 600 may be referred to as a single writing cycle, and a plurality of writing cycles may be performed in order to pattern the surface of the substrate. The process sequence 600 may be performed by a plurality of DMDs 410 that is a part of a plurality of image projection systems, and the substrate is moving under the plurality of image projection systems.

Figure 7:
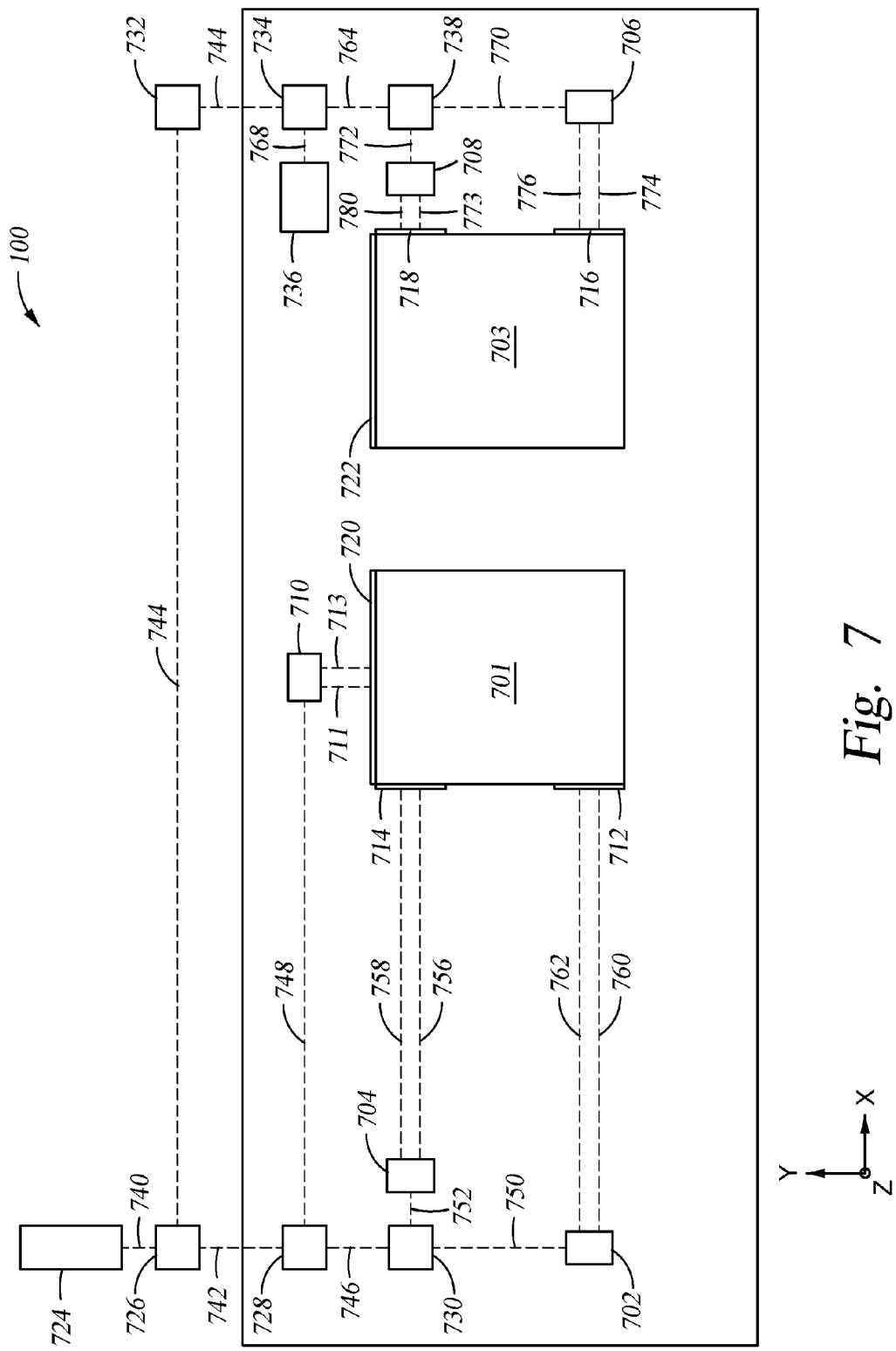
FIG. 7 is a schematic top view of the system according to one embodiment.

FIG. 7 is a schematic top view of the system 100 according to one embodiment. To better illustrate the chucks 130 and the interferometers 702, 704, 706, 708, 710, the processing apparatus 160 is omitted. The interferometers 702, 704, 706, 708, 710 may be the interferometers 142 shown in FIG. 1. As shown in FIG. 7, a plurality of mirrors 712, 714, 716, 718, 720, 722 may be coupled to chucks 701, 703 and the mirrors 712, 714, 716, 718 may be aligned in the X-direction and Z-direction with the interferometers 702, 704, 706, 708, respectively. The mirrors 720, 722 may be aligned in the Z-direction with the interferometer 710. The chucks 701, 703 may be the chucks 130 shown in FIG. 1 and the mirrors 712, 714, 716, 718, 720, 722 may be the mirrors 144 shown in FIG. 1. The chuck 701 is at the processing position, as shown in FIG. 7. The chucks 701, 703 are aligned in the X-direction, and the interferometers 702, 704 and the interferometers 706, 708 are disposed along in the Y-direction, which is substantially perpendicular to the X-direction. In some embodiments, the mirrors 712, 714 and the mirrors 716, 718 may be a single piece of mirror that covers the entire length of the side of each chuck 701, 703.

A laser source 724 may be utilized to provide a laser beam 740 directed to a first beam splitter 726. The laser beam 740 may have any suitable wavelength, such as about 550 nm. The first beam splitter 726 splits the laser beam 740 to a first sub beam 742 and a second sub beam 744. The first sub beam 742 may be directed to a second beam splitter 728, which splits the first sub beam 742 to a third sub beam 746 and a fourth sub beam 748. The third sub beam 746 may be directed to a third beam splitter 730 and the fourth sub beam 748 may be directed to the interferometer 710. The fourth sub beam 748 may be the beam 711 out of the interferometer 710 directed to the mirror 720, and the mirror 720 reflects the beam 711, shown as a reflecting beam 713, back to the interferometer 710. The signal phase change between the beam 711 and the reflecting beam 713 is used to detect any change in the distance between the interferometer 710 and the mirror 720, i.e., any change in the Y-direction. Any change in the Y-direction can be translated into the location of the substrate (not shown) disposed on the chuck 701 with respect to the Y-direction during operation. In one embodiment, one interferometer 710 is disposed between the chucks 701, 703. During operation, the interferometer 710 measures the location of the substrate (not shown) disposed on the chuck 701 or 703 that is in operating position with respect to the Y-direction.

The third beam splitter 730 splits the third sub beam 746 into a fifth sub beam 750 directed to the interferometer 702 and a sixth sub beam 752 directed to the interferometer 704. Similarly, the interferometer 702 directs a beam 760 to the mirror 712, which directs a reflecting beam 762 back to the interferometer 702, and the interferometer 704 directs a beam 756 to the mirror 714, which directs a reflecting beam 758 back to the interferometer 704. The interferometers 702, 704 detect any change in distance between the interferometers 702, 704 and the mirrors 712, 714, respectively, i.e., any change in the X-direction. Any change in the X-direction can be translated into the location of the substrate (not shown) disposed on the chuck 701 with respect to the X-direction during operation. In case there is a difference between the data provided by the interferometer 702 and the data provided by the interferometer 704, the image projection systems 301 that are aligned with the mirror 714 in the Y-direction may be loaded with data provided by the interferometer 704, the image projection systems 301 that are aligned with the mirror 712 in the Y-direction may be loaded with data provided by the interferometer 702, and the image projection systems 301 that are disposed between the mirrors 712, 714 may be loaded with data that is the average of the data provided by the interferometers 702, 704. The difference may be caused by yaw rotation of the chuck 701. Having two interferometers 702, 704 measuring the location of the substrate 140 with respect to the X-direction instead of using one interferometer for measuring compensates for the difference caused by yaw rotation.

The second sub beam 744 may be directed to a mirror 732 which directs the second sub beam 744 to a fourth beam splitter 734. The fourth beam splitter 734 splits the second sub beam 744 to a seventh sub beam 768 directed to a wavelength tracker 736 and an eighth sub beam 764 directed to a fifth beam splitter 738. The wavelength of the laser beams can be affected by the environment conditions such as temperature, pressure, or humidity. The wavelength tracker 736 tracks changes in the air's index of refraction to optically compensate for environmental changes. The fifth beam splitter 738 splits the eighth sub beam 764 to a ninth sub beam 772 directed to the interferometer 708 and a tenth sub beam 770 directed to the interferometer 706. Similarly, the interferometer 708 directs a beam 773 to the mirror 718, which directs a reflecting beam 780 back to the interferometer 708, and the interferometer 706 directs a beam 774 to the mirror 716, which directs a reflecting beam 776 back to the interferometer 706. The interferometers 706, 708 detect any change in distance between the interferometers 706, 708 and the mirrors 716, 718, respectively, i.e., any change in the X-direction. Any change in the X-direction can be translated into the location of the substrate (not shown) disposed on the chuck 703 with respect to the X-direction during operation. As shown in FIG. 7, for each chuck, two interferometers are utilized to measure the location of the substrate with respect to the X-direction, while for both chucks, one interferometer is utilized to measure the location of the substrate with respect to the Y-direction. The location of and the number of beam splitters may vary.

Figure 8:
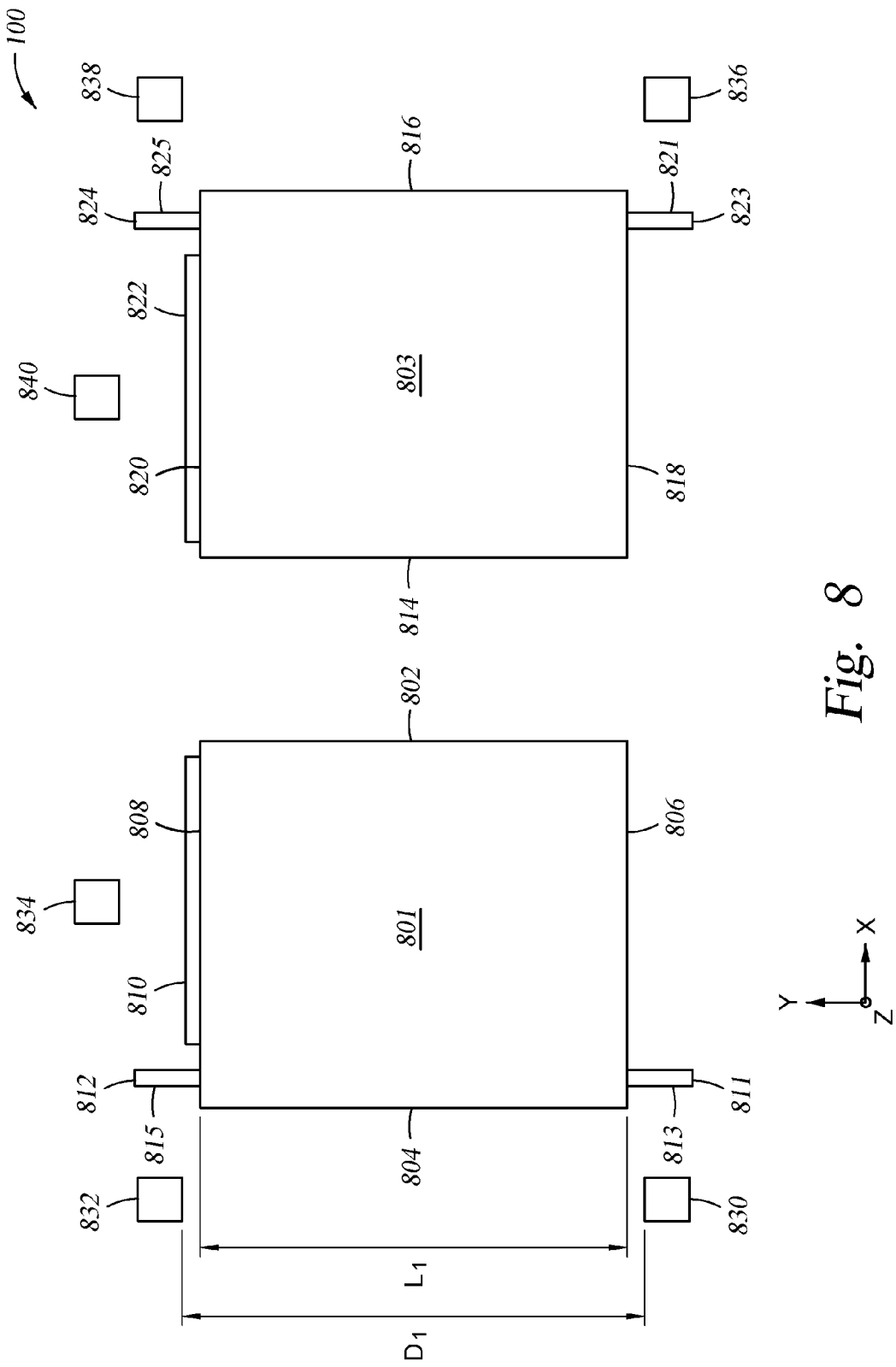
FIG. 8 is a schematic top view of the system according to another embodiment.

FIG. 8 is a schematic top view of the system 100 according to another embodiment. The processing apparatus 160, the laser source and the plurality of beam splitters are omitted for better illustration of other components. The system includes a first chuck 801 and a second chuck 803. The first and second chucks 801, 803 may be the same as the chucks 130 shown in FIG. 1. The first chuck 801 includes a first side 802, a second side 804 opposite the side 802, a third side 806 connecting the first side 802 and the second side 804, and a fourth side 808 opposite the third side 806. In some embodiments, the first and second sides 802, 804 are substantially parallel, and the third and fourth sides 806, 808 are substantially parallel. A first mirror 810 may be disposed on the fourth side 808, a second mirror 811 may be disposed on the third side 806, and a third mirror 812 may be disposed on the fourth side 808. A first interferometer 830 may be aligned with the mirror 811 in the X-direction and the Z-direction. The mirror 811 may include a surface 813 for reflecting a laser beam to the interferometer 830, and the surface 813 may be substantially perpendicular to the third side 806 on which the mirror 811 is disposed. A second interferometer 832 may be aligned with the mirror 812 in the X-direction and the Z-direction. The mirror 812 may include a surface 815 for reflecting a laser beam to the interferometer 832, and the surface 815 may be substantially perpendicular to the fourth side 808 on which the mirror 812 is disposed. The interferometers 830, 832 detect any change in distance between the interferometers 830, 832 and the mirrors 811, 812, respectively, i.e., any change in the X-direction. Any change in the X-direction can be translated into the location of the substrate (not shown) disposed on the chuck 801 with respect to the X-direction during operation. A third interferometer 834 may be aligned with the mirror 810 in the Z-direction for directing a laser beam to and receiving a reflecting beam from the mirror 810. The interferometer 834 detects any change in distance between the interferometer 834 and the mirror 810, i.e., any change in the Y-direction. Any change in the Y-direction can be translated into the location of the substrate (not shown) disposed on the chuck 801 with respect to the Y-direction during operation.

The second chuck 803 includes a first side 814, a second side 816 opposite the first side 814, a third side 818 connecting the first side 814 and the second side 816, and a fourth side 820 opposite the third side 818. In some embodiments, the first and second sides 814, 816 are substantially parallel, and the third and fourth sides 818, 820 are substantially parallel. A first mirror 822 may be disposed on the fourth side 820, a second mirror 823 may be disposed on the third side 818, and a third mirror 824 may be disposed on the fourth side 820. A first interferometer 836 may be aligned with the mirror 823 in the X-direction and the Z-direction. The mirror 823 may include a surface 821 for reflecting a laser beam to the interferometer 836, and the surface 821 may be substantially perpendicular to the third side 818 on which the mirror 823 is disposed. A second interferometer 838 may be aligned with the mirror 824 in the X-direction and the Z-direction. The mirror 824 may include a surface 825 for reflecting a laser beam to the interferometer 838, and the surface 825 may be substantially perpendicular to the fourth side 820 on which the mirror 824 is disposed. The interferometers 836, 838 detect any change in distance between the interferometers 836, 838 and the mirrors 823, 824, respectively, i.e., any change in the X-direction. Any change in the X-direction can be translated into the location of the substrate (not shown) disposed on the chuck 803 with respect to the X-direction during operation. A third interferometer 840 may be aligned with the mirror 822 in the Z-direction for directing a laser beam to and receiving a reflecting beam from the mirror 822. The interferometer 840 detects any change in distance between the interferometer 840 and the mirror 822, i.e., any change in the Y-direction. Any change in the Y-direction can be translated into the location of the substrate (not shown) disposed on the chuck 803 with respect to the Y-direction during operation. The interferometers 830, 836 may be aligned in the X-direction and Z-direction, and the interferometers 832, 838 may be aligned in the X-direction and Z-direction. The interferometers 830, 832 may be aligned in the Y-direction and Z-direction, and the interferometers 836, 838 may be aligned in the Y-direction and Z-direction.

Figure 9:
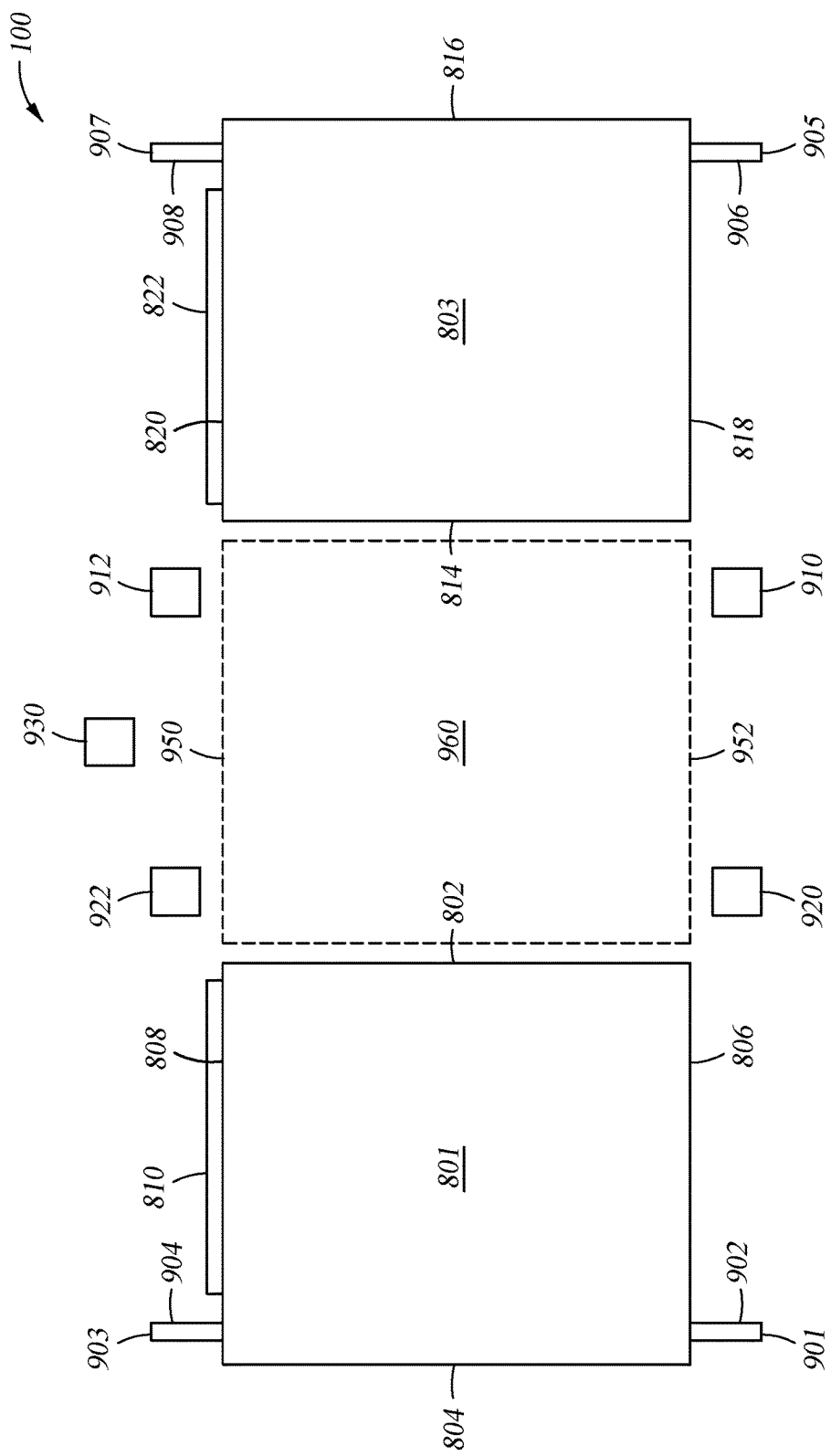
FIG. 9 is a schematic top view of the system according to another embodiment.

As shown in FIG. 8, the distance D1 between the interferometers 830, 832 may be greater than a length L1 of the second side 804 of the chuck 801. Similarly, the distance between the interferometers 836, 838 may be greater than the length of the second side 816 of the chuck 803. Thus, the interferometers for measuring the location of the substrate in the X-direction may be disposed at a location adjacent the third and fourth sides of the chuck during operation. FIG. 9 is a schematic top view of the system 100 showing such configuration. The system may include the chucks 801, 803. Mirrors 901, 903 may be disposed on sides 806, 808 of chuck 801, respectively. Mirrors 905, 907 may be disposed on sides 818, 820 of chuck 803, respectively. Mirrors 901, 903 may be aligned in the Z-direction, mirrors 905, 907 may be aligned in the Z-direction, but the mirror 901 or 903 is not aligned with the mirror 905 or 907 in the Z-direction, respectively. Mirrors 901, 903, 905, 907 may each include a surface 902, 904, 906, 908, respectively, for reflecting a laser beam. The surfaces 902, 904, 906, 908 may be substantially perpendicular to the sides 806, 808, 818, 820, respectively.

During operation, either chuck 801 or 803 is moved along the X-direction to the processing position, shown as chuck 960 represented by dotted lines. The chuck 960, which represents either the chuck 801 or chuck 803 in the processing position, includes sides 950, 952. As shown in FIG. 9, interferometers 910, 920 may be disposed at a location adjacent the side 952, and interferometers 912, 922 may be disposed at a location adjacent the side 950. The interferometer 910 is utilized to measure the location of the substrate disposed on the chuck 801 with respect to the X-direction, and the interferometer 920 is utilized to measure the location of the substrate disposed on the chuck 803 with respect to the X-direction. Thus, the interferometer 910 and the mirror 901 are aligned in the Z-direction, and the interferometer 920 and the mirror 905 are aligned in the Z-direction. The interferometer 910 and the mirror 901 are not aligned in the Z-direction with the interferometer 920 and the mirror 905 in order to prevent the mirror 901 or 905 from hitting the interferometer 920 or 910 during operation. The interferometer 912 is utilized to measure the location of the substrate disposed on the chuck 801 with respect to the X-direction, and the interferometer 922 is utilized to measure the location of the substrate disposed on the chuck 803 with respect to the X-direction. Thus, the interferometer 912 and the mirror 903 are aligned in the Z-direction, and the interferometer 922 and the mirror 907 are aligned in the Z-direction. The interferometer 912 and the mirror 903 are not aligned in the Z-direction with the interferometer 922 and the mirror 907 in order to prevent the mirror 903 or 907 from hitting the interferometer 922 or 912 during operation. The interferometers 910, 912 detect any change in distance between the interferometers 910, 912 and the mirrors 901, 903, respectively, i.e., any change in the X-direction. Any change in the X-direction can be translated into the location of the substrate (not shown) disposed on the chuck 801 with respect to the X-direction during operation. Due to the location of the interferometers 910, 912, the beam path from the interferometers 910, 912 to the mirrors 901, 903, respectively, is reduced. With reduced beam path, improved accuracy of the location measurement can be achieved. The interferometers 920, 922 detect any change in distance between the interferometers 920, 922 and the mirrors 905, 907, respectively, i.e., any change in the X-direction. Any change in the X-direction can be translated into the location of the substrate (not shown) disposed on the chuck 803 with respect to the X-direction during operation. Due to the location of the interferometers 920, 922, the beam path from the interferometers 920, 922 to the mirrors 905, 907, respectively, is reduced. With reduced beam path, improved accuracy of the location measurement can be achieved. An interferometer 930 may be disposed between the interferometers 912, 922 to detect any change in distance between the interferometer 930 and the mirror 810 or 822, i.e., any change in the Y-direction. Any change in the Y-direction can be translated into the location of the substrate (not shown) disposed on the chuck 801 or 803 with respect to the Y-direction during operation.

Conventionally, there is an assumption that the substrate is moving at a constant speed and the orientation of the substrate remains unchanged as the substrate moves under the DMD. The mask pattern data provided to the memory cells of the DMD is based on such assumption. However, the location and position of the substrate may deviate from previously determined location and position due to various reasons, such as substrate to substrate variations, system vibrations, substrate variation distortions including thickness, or process induced distortions in long range (greater than 50 mm in the scanning direction) or localized areas (less than 50 mm in the scanning direction). As a result, there are increased numbers of positional errors of the mask pattern formed on the substrate.

In order to reduce positional errors of the mask pattern formed on the substrate, the mask pattern data provided to the DMD 410 (FIG. 4) is modified or corrected by the controller based on the location and position information of the substrate. Since the time duration of the process sequence 600 is greater than the time duration of reflecting the light beam to the surface of the substrate, there is enough time to modify the mask pattern data provided to the DMD 410 before the light beam is reflected by the mirrors of the DMD 410. For example, referring back to FIG. 6, at block 610 of the process sequence 600, the memory cells are addressed with the modified mask pattern data based on the location and position of the substrate that is moving under the DMD 410. In other words, the mask pattern data can be modified on-the-fly. The location and position information of the substrate that is moving under the DMD 410 may be obtained by any suitable method. The location information of the substrate may be determined by the encoder 126, or more accurately, by one or more interferometers shown in FIG. 1, FIG. 7, FIG. 8 or FIG. 9, that measure the distance between the substrate or the stage and the interferometers both in the X-direction and Y-direction. The location information may include an X-direction component and a Y-direction component. The position information of the substrate may be determined by a camera attached to each image projection system. As the substrate moves under the image projection systems, the cameras capture the position, or orientation, of the substrate. The orientation information may include an X-direction component and a Y-direction component. The location and position information of the substrate that is moving under the DMD 410 is provided to the controller, and the controller determines whether the location and position of the substrate have deviated from the previously determined location and position. The deviation may be in one of the X and Y directions or both the X and Y directions. If the location and position of the substrate have deviated from the previously determined location and position, the controller modifies the mask pattern data that is to be provided to the DMD 410, and updates the memory cells of the DMD 410. The modification of the location and/or position information may include extrapolating one of or both of the X-direction and Y-direction components. In some embodiments, the X-direction component is extrapolated linearly. In some embodiments, the Y-direction component is extrapolated linearly or non-linearly, such as quadratic. The location and position information may be provided to the controller for each process sequence 600, or writing cycle, and the mask pattern data may be modified in each writing cycle if the location and position of the substrate have deviated from the previously determined location and position.

Figure 10:
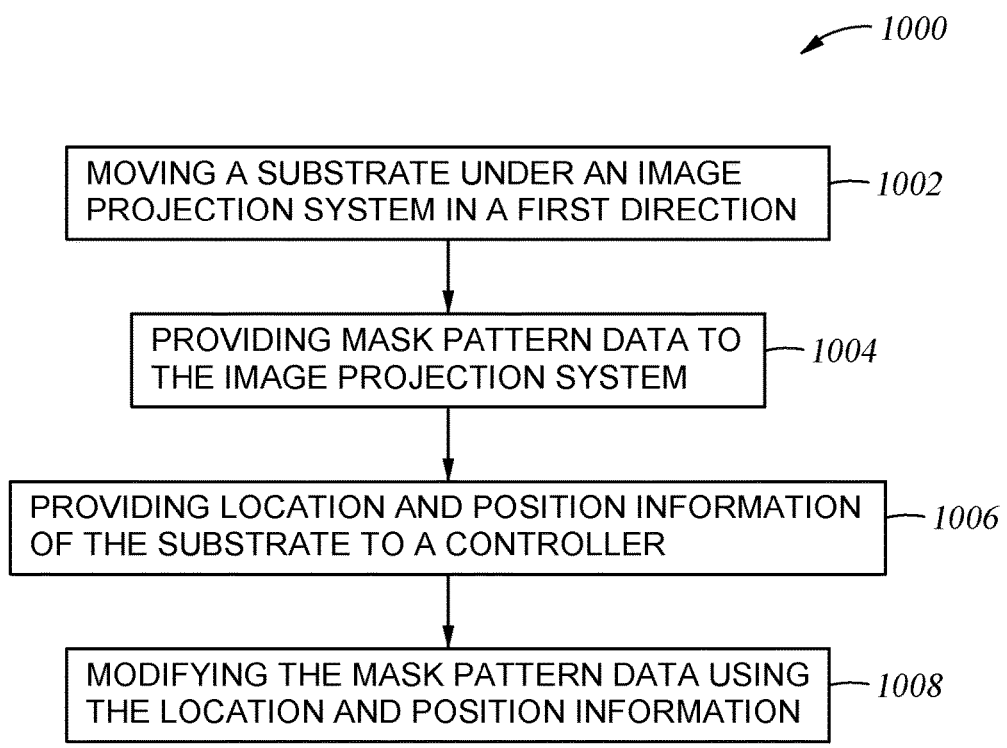
FIG. 10 illustrates steps for reducing positional errors of a pattern formed on a substrate according to various embodiments.

FIG. 10 illustrates steps 1000 for reducing positional errors of a pattern formed on a substrate according to various embodiments. At block 1002, a substrate is moved under an image projection system in a first direction. The substrate may be the substrate 140 disposed on the chuck 130 of the system 100 (FIG. 1), and the image projection system may be one of the plurality of image projection systems 301 (FIG. 3). The first direction may be the X-direction as shown in FIG. 1. The substrate includes a surface that is to be patterned by the plurality of image projection systems. At block 1004, mask pattern data is provided to the image projection system. The mask pattern data may be provided to the memory cells of the DMD in each image projection system by a controller. The mask pattern data for the surface of the substrate may be divided into a plurality of partitions, and each partition is provided to the memory cells of the DMDs of the plurality of image projection systems during corresponding process sequence. The process sequence may be the process sequence 600. For example, to form a pattern on the surface of the substrate, there are N numbers of process sequences to be performed on the surface, and there are N numbers of partitions of mask pattern data.

Next, at block 1006, location and position information of the moving substrate is provided to the controller. The location and position information of the moving substrate may be provided to the controller for each process sequence. The location and position information of the moving substrate is used to modify the mask pattern data, as shown at block 1008. Each partition of the mask pattern data may be modified based on the location and position information of the moving substrate if the location and position of the moving substrate have deviated from the previously determined location and position. Again the modification of the location and/or position information may include extrapolating one of or both of the X-direction and Y-direction components of the location and/or position information. In some embodiments, the X-direction component is extrapolated linearly. In some embodiments, the Y-direction component is extrapolated linearly or non-linearly, such as quadratic. The modified mask pattern data may be sent to the memory cells of the DMDs to control the tilting of the mirrors by the controller. For example, a mirror of the plurality of mirrors of a DMD in the plurality of image projection systems is to be tilted to "on" position based on original mask pattern data during a specific process sequence. However, the location and/or position of the substrate have been deviated from the original location and/or position, and the new location and/or position information of the substrate has been obtained and provided to the controller. The controller than modifies the mask pattern data for the specific process sequence, and signals the mirror to tilt to "off" position instead of "on" position during the specific process sequence in order to compensate for the deviation in the location and/or position. With the mirrors tilted to the new position based on the updated location and position information, a light beam or pulse is directed to the mirrors, and at least one mirror may reflect the light to the surface of the substrate. In addition to forming the predetermined pattern on the surface of the substrate by using the steps 1000 when the location and position of the substrate have been deviated from the predetermined location and position, steps 1000 may be utilized to match a pattern exposed from other exposure tools on the surface of the substrate using the system 100.

In addition to the steps 1000 shown in FIG. 10, positional errors of the pattern formed on the substrate may be further reduced by reducing the electromagnetic energy delivered to the surface of the substrate during each process sequence. In other words, a single light image pixel formed on an area of the surface of the substrate is not light enough to form the pattern, and it may take a plurality of light image pixels to accumulate on the same area to be light enough to form the pattern. In this manner, if the location of any single light image pixel on the surface of the substrate is incorrect, that single light image pixel on its own is not light enough to form the pattern. Since the location of the subsequent light image pixels are corrected using the steps 1000 described in FIG. 10, the positional errors of the pattern formed on the substrate are further reduced.

Embodiments described herein may further include a system including a slab and two chucks disposed on the slab. The two chucks are aligned in a first direction, and each chuck has a first side facing the other chuck, a second side opposite the first side, a third side connecting the first and second sides, and a fourth side opposite the third side. The system further includes a first interferometer and a second interferometer, and the first interferometer is disposed at a location adjacent the third side of one of the two chucks during operation and the second interferometer is disposed at a location adjacent the third side of the other chuck of the two chucks during operation. The system further includes a third interferometer disposed between the first interferometer and the second interferometer.

Embodiments described herein may further include a method including moving a substrate under a plurality of image projection systems in a first direction, providing a mask pattern data to the plurality of image projection systems, providing location and position information of the substrate to a controller, and modifying the mask pattern data using the location and position information by controlling a plurality of mirrors in a digital micro-mirror device (DMD) disposed in each of the plurality of image projection systems.

Embodiments described herein may further include a method including moving a substrate under an image projection system, providing location and position information of the substrate to a controller, controlling a plurality of mirrors in a DMD disposed in the image projection system by the controller, directly a light to the plurality of mirrors of the DMD, and reflecting the light to a surface of the substrate by at least one mirror of the plurality of mirrors.

While the foregoing is directed to embodiments of the present disclosure, other and further embodiments of the disclosure may be devised without departing from the basic scope thereof, and the scope thereof is determined by the claims that follow.

The invention claimed is:

1. A system, comprising:
   a slab;
   a chuck disposed on the slab, wherein the chuck has a first side and a second side opposite the first side;
   a first mirror disposed on the first side of the chuck, wherein the first mirror has a reflecting surface substantially perpendicular to the first side;
   a second mirror disposed on the second side of the chuck, wherein the second mirror has a reflecting surface substantially perpendicular to the second side;
   a first interferometer disposed on the slab at a location adjacent the first side of the chuck, wherein the first interferometer is aligned with the reflecting surface of the first mirror; and
   a second interferometer disposed on the slab at a location adjacent the second side of the chuck, wherein the second interferometer is aligned with the reflecting surface of the second mirror.

2. The system of claim 1, further comprising a laser source and a plurality of beam splitters, wherein the laser source and the plurality of beam splitters are capable of directing a laser beam to the first and second interferometers.

3. The system of claim 2, further comprising a wavelength tracker.

4. The system of claim 1, wherein the first and second interferometers are high stability plane mirror interferometers.

5. The system of claim 1, further comprising a processing apparatus disposed over the chuck.

6. The system of claim 5, wherein the processing apparatus comprises a support disposed on the slab and a processing unit disposed on the support.

7. A system, comprising:
   a slab;
   a chuck disposed on the slab, wherein the chuck has a first side and a second side opposite the first side;
   a first mirror disposed on the first side of the chuck, wherein the first mirror has a reflecting surface substantially perpendicular to the first side;
   a second mirror disposed on the second side of the chuck, wherein the second mirror has a reflecting surface substantially perpendicular to the second side;
   a third mirror disposed on the first side of the chuck, wherein the third mirror has a reflecting surface substantially parallel to the first side;
   a first interferometer disposed on the slab at a location adjacent the first side of the chuck, wherein the first interferometer is aligned with the reflecting surface of the first mirror;
   a second interferometer disposed on the slab at a location adjacent the fourth side of the chuck, wherein the second interferometer is aligned with the reflecting surface of the second mirror; and
   a third interferometer aligned with the third mirror.

8. The system of claim 7, further comprising a laser source and a plurality of beam splitters, wherein the laser source and the plurality of beam splitters are capable of directing a laser beam to the first and second interferometers.

9. The system of claim 8, further comprising a wavelength tracker.

10. The system of claim 7, wherein the first, second and third interferometers are high stability plane mirror interferometers.

11. The system of claim 7, further comprising a processing apparatus disposed over the chuck.

12. The system of claim 11, wherein the processing apparatus comprises a support disposed on the slab and a processing unit disposed on the support.

13. The system of claim 12, wherein the processing unit comprises a plurality of image projection systems.

14. A method, comprising:
   moving a substrate in a first direction, wherein the substrate is disposed on a chuck; and
   providing location and position information of the substrate to a controller, wherein at least a portion of the location information is obtained by a first interferometer and a second interferometer, wherein the first interferometer is aligned with a reflecting surface of a first mirror disposed on a first side of the chuck, wherein the reflecting surface of the first mirror is substantially perpendicular to the first side of the chuck, wherein the second interferometer is aligned with a reflecting surface of a second mirror disposed on a second side of the chuck opposite the first side, wherein the reflecting surface of the second mirror is substantially perpendicular to the second side.

15. The method of claim 14, wherein the substrate is moved under an image projection system.

16. The method of claim 15, wherein the image projection system includes a digital micro-mirror device, wherein each digital micro-mirror device includes a plurality of mirrors and a plurality of memory cells, and wherein each mirror has a corresponding memory cell.

17. The method of claim 16, wherein a surface of the substrate is patterned using a plurality of process sequences of the digital micro-mirror device.

18. The method of claim 14, wherein the position information is obtained by a camera.

19. The method of claim 14, further comprising moving the substrate under the image projection system in a second direction, wherein the second direction is substantially perpendicular to the first direction.

20. The method of claim 19, wherein the location information and the position information each includes a component in the first direction and a component in the second direction.

* * * * *